(12) United States Patent
Wei et al.

(10) Patent No.: US 10,819,547 B2
(45) Date of Patent: Oct. 27, 2020

(54) METHOD FOR SPREADING DATA SYMBOL FREQUENCY DOMAIN INFORMATION IN POWER LINE CARRIER COMMUNICATION

(71) Applicant: Wu Qi Technologies, Inc., Yubei District, Chongqing (CN)

(72) Inventors: Ren Wei, Chongqing (CN); Qiang Gu, Chongqing (CN); Hongbing Li, Chongqing (CN); Bairu Chen, Chongqing (CN); Anhui Zeng, Chongqing (CN)

(73) Assignee: Wu Qi Technologies, Inc., Chongqing (CN)

( * ) Notice: Subject to any disclaimer, the term of this patent is extended or adjusted under 35 U.S.C. 154(b) by 0 days.

(21) Appl. No.: 16/623,288

(22) PCT Filed: Mar. 19, 2018

(86) PCT No.: PCT/CN2018/079426
§ 371 (c)(1),
(2) Date: Dec. 16, 2019

(87) PCT Pub. No.: WO2019/041785
PCT Pub. Date: Mar. 7, 2019

(65) Prior Publication Data
US 2020/0267036 A1  Aug. 20, 2020

(30) Foreign Application Priority Data
Aug. 30, 2017  (CN) .......................... 2017 1 0764337

(51) Int. Cl.
*H04L 27/04* (2006.01)
*H04L 27/12* (2006.01)
(Continued)

(52) U.S. Cl.
CPC .... *H04L 27/2605* (2013.01); *H03M 13/2771* (2013.01); *H03M 13/2957* (2013.01); *H04B 3/54* (2013.01); *H04L 27/34* (2013.01)

(58) Field of Classification Search
CPC ... H04L 27/2605; H04L 27/34; H04L 1/1896; H04L 1/0009; H04L 25/03159;
(Continued)

(56) References Cited

U.S. PATENT DOCUMENTS

| | | | |
|---|---|---|---|
| 6,590,860 B1 * | 7/2003 | Sakoda | H04L 1/0054 |
| | | | 370/203 |
| 7,394,858 B2 * | 7/2008 | Sadowsky | H04B 7/0408 |
| | | | 375/260 |

(Continued)

FOREIGN PATENT DOCUMENTS

| CN | 106788946 A | 5/2017 |
|---|---|---|
| CN | 107017975 A | 8/2017 |

OTHER PUBLICATIONS

International Search Report Issued in Counterpart PCT Application No. PCT/CN2018/079426.

*Primary Examiner* — Phuong Phu
(74) *Attorney, Agent, or Firm* — Amster, Rothstein & Ebenstein, LLP

(57) ABSTRACT

Disclosed is a method for spreading data symbol frequency domain information in power line carrier communication, wherein when generating a data symbol in power line carrier communication, multiple times of frequency domain information diversity copy is used in place of the conventional ROBO copy, such that the diversity copy is independent of channel time-varying property, but only dependent on channel characteristics; as such, diversity copy is implemented within the same symbol, which facilitates simplifying the (Continued)

processing circuit of frequency domain and meanwhile enhances communication reliability.

4 Claims, 3 Drawing Sheets

(51) Int. Cl.
    *H04L 27/20*     (2006.01)
    *H04L 27/26*     (2006.01)
    *H03M 13/27*     (2006.01)
    *H03M 13/29*     (2006.01)
    *H04B 3/54*     (2006.01)
    *H04L 27/34*     (2006.01)

(58) Field of Classification Search
    CPC ... H04L 5/0044; H04L 1/0025; H04L 1/0054; H04L 1/06; H03M 13/2771; H03M 13/2957; H03M 13/27; H04B 3/54; H04B 7/0851; H04B 7/0617; H04B 7/0408; H04W 16/02; H04W 28/04
    USPC .................. 375/299, 267, 260, 261, 265
    See application file for complete search history.

(56) References Cited

U.S. PATENT DOCUMENTS

| | | | | |
|---|---|---|---|---|
| 7,616,704 | B2* | 11/2009 | Li | H04B 7/0617 375/260 |
| 8,781,006 | B2* | 7/2014 | Avudainayagam | H04L 1/0009 375/260 |
| 9,003,243 | B2* | 4/2015 | Wang | H03M 13/27 714/702 |
| 10,200,171 | B2* | 2/2019 | Lin | H04W 28/04 |
| 2005/0152266 | A1* | 7/2005 | Hwang | H04L 1/06 370/210 |
| 2006/0222091 | A1* | 10/2006 | Rhodes | H04L 1/0025 375/260 |
| 2009/0052578 | A1* | 2/2009 | Sawai | H04B 7/0851 375/299 |
| 2011/0317784 | A1* | 12/2011 | Schwager | H04L 5/0044 375/295 |
| 2015/0318967 | A1* | 11/2015 | Lyu | H04L 1/1896 370/330 |
| 2017/0208596 | A1* | 7/2017 | Wang | H04W 16/02 |
| 2018/0019905 | A1* | 1/2018 | Zhu | H04L 25/03159 |

* cited by examiner

METHOD FOR SPREADING DATA SYMBOL FREQUENCY DOMAIN INFORMATION IN POWER LINE CARRIER COMMUNICATION

This application is a National Stage entry under 35 U.S.C. 371 of International Patent Application No. PCT/CN2018/079426, filed on Mar. 19, 2018, which claims priority from Chinese Patent Application No. CN 201710764337.3, filed Aug. 30, 2017, the entire contents of each of which are incorporated by reference herein.

FIELD

The present disclosure relates to a method for spreading data symbol frequency domain information in power line carrier communication.

BACKGROUND

With increasing applications of power line carrier communication technologies, it becomes more demanding on the reliability of information transmission via a power line medium, which boosts the State Grid Power Line Transmission Standards (hereinafter referred to as State Grid Standards). FIG. 1 shows a schematic diagram of a communication frame format in the State Grid Standards, wherein the temporal sequence of the communication frame is as such: first, 13 preamble symbols, followed by 4 or 12 frame control word symbols, and finally the symbol of transmitted data. FIG. 2 describes the method of generating frame control word symbols in the State Grid Standards, including: first, performing Turbo coding to the to-be-transmitted data; then, performing channel interleaving; and finally, performing diversity copy to generate frame control word symbols. FIG. 3 describes the method of generating data symbols in the State Grid Standards, including: first, scrambling the to-be-transmitted data; then, performing Turbo coding and channel interleaving; and finally, performing ROBO copy to generate the data symbol. Scrambling refers to subjecting a data stream to an "OR" operation with a repeating pseudo-random sequence generated by a scramble polynomial. Turbo coding is a well-known channel coding technology, which has a decoding performance close to Shannon limit, as well as a strong anti-noise/anti-fade/anti-interference property. Channel interleaving refers to a processing of randomizing data before they are transmitted to the channel. The most significant difference between the method of generating frame control word symbols and the method of generating data symbols lies in the processing procedure following channel interleaving, wherein the frame control word symbols adopt diversity copy, while the data symbols adopt ROBO copy. Diversity copy refers to mapping information bits transmitted within a same symbol to different subcarriers, and performing, after the receiving end receives the symbol, diversity reception to the information on corresponding subcarriers, thereby completing information transmission. ROBO copy refers to mapping the to-be-transmitted information bits onto subcarriers in different symbols, wherein to correctly receive the information bits, the receiving end needs to perform corresponding de-ROBO to each received symbol. Power line channels generally exhibit an apparent time-varying characteristic; therefore, when ROBO copy is adopted to generate data symbols, the same information bits are mapped to different symbols, which increases the probability of reception error and further deteriorates reliability.

SUMMARY

The present disclosure provides a method for spreading data symbol frequency domain information in power line carrier communication, which may enhance communication reliability while simplifying circuit complexity.

To achieve the objective above, the present disclosure provides a method for generating a data symbol in power line carrier communication, comprising steps of:

Step S1: subjecting to-be-transmitted data to scramble processing;

Step S2: subjecting the scrambled data to Turbo coding;

Step S3: subjecting the Turbo coded data to channel interleaving;

Step S4: subjecting the channel interleaved data to multiple times of frequency domain information diversity copy within the same symbol to thereby generate the data symbol.

In step S4, the multiple times of frequency domain information diversity copy specifically comprises:

dividing N information bits into groups based on the number of times B×M of diversity copy, each group including N/(B×M) information bits;

mapping, according to a mapping rule, N/(B×M) information bits in the first group to a group of all available N/(B×M) subcarriers of the first symbol;

mapping, according to the mapping rule, N/(B×M) information bits in the second group to a group of all available N/(B×M) subcarriers of the second symbol;

and so on, till transmitting all the B×M groups of information data;

where N denotes the number of bits of Turbo coded data;

B denotes the number of bits of the information that may be carried by each modulated subcarrier;

M denotes the number of times of diversity copy.

The mapping rule refers to mapping according to a sequential or any kind of correspondence relationship.

The mapping scheme refers to mapping according a sequential or any kind of correspondence relationship.

The present disclosure further provides a method for spreading data symbol frequency domain information in power line carrier communication, comprising:

dividing N information bits into groups based on the number of times B×M of diversity copy, each group including N/(B×M) information bits;

mapping, according to a mapping rule, N/(B×M) information bits in the first group to a group of all available N/(B×M) subcarriers of the first symbol;

mapping, according to the mapping rule, N/(B×M) information bits in the second group to a group of all available N/(B×M) subcarriers of the second symbol;

and so on, till transmitting all the B×M groups of information data;

where N denotes the number of bits of Turbo coded data;

B denotes the number of bits of the information that may be carried by each modulated subcarrier;

M denotes the number of times of diversity copy.

The mapping rule refers to mapping according a sequential or any kind of correspondence relationship.

The mapping scheme refers to mapping according to a sequential or any kind of correspondence relationship.

According to the present disclosure, when generating a data symbol in power line carrier communication, multiple times of frequency domain information diversity copy is used in place of the conventional ROBO copy, such that the diversity copy is independent of channel time-varying property, but only dependent on channel characteristics; as such, diversity copy is implemented within the same symbol, which facilitates simplifying the processing circuit of frequency domain and meanwhile enhances communication reliability.

DETAILED DESCRIPTION OF EMBODIMENTS

Hereinafter, the preferred embodiments of the present disclosure will be illustrated in detail with reference to FIGS. 1~5.

Figure 1:
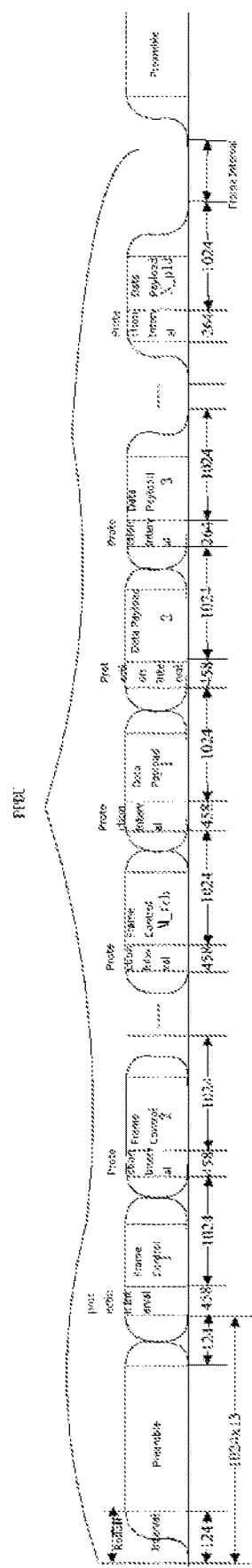
FIG. 1 is a schematic diagram of a communication frame format in the State Grid Standard as depicted in the Background section of the present disclosure.
Figure 2:
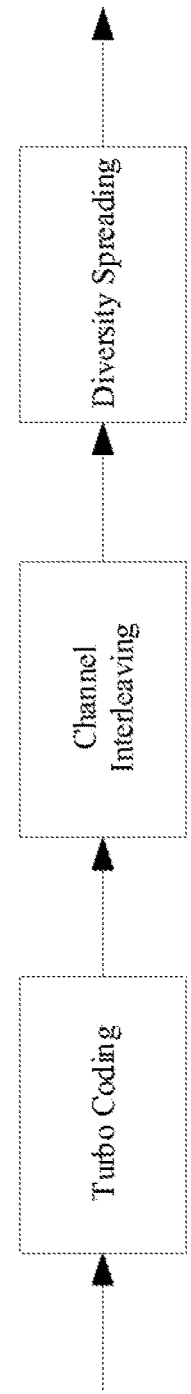
FIG. 2 illustrates a conventional method of generating frame control word symbols in the State Grid Standard as depicted in the Background section of the present disclosure.
Figures 3, 4:
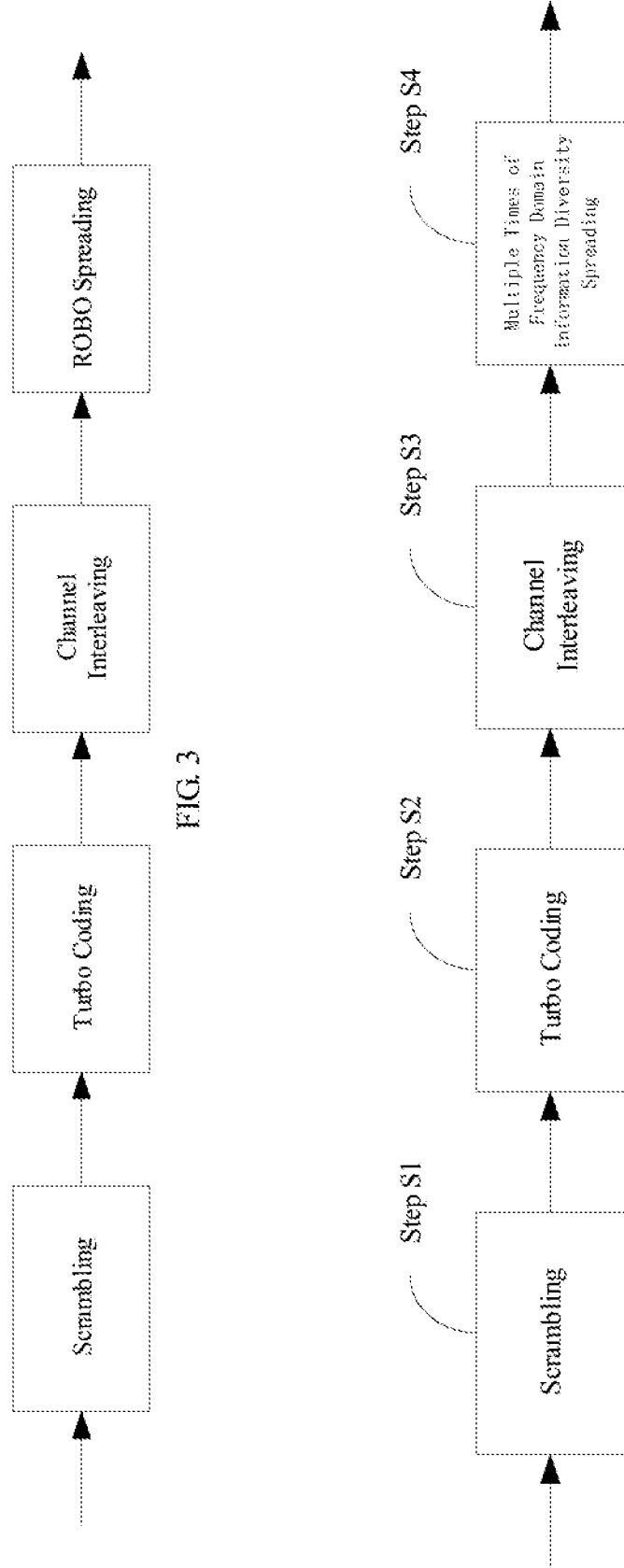
FIG. 3 illustrates a conventional method of generating a data symbol in the State Grid Standard as depicted in the Background section of the present disclosure.
FIG. 4 is a flow diagram of a method for generating a data symbol in power line carrier communication according to the present disclosure.

As shown in FIG. 4, a method for generating a data symbol in power line carrier communication according to the present disclosure specifically comprises steps of:

Step S1: subjecting to-be-transmitted data to scramble processing;

Step S2: subjecting the scrambled data to Turbo coding;

Step S3: subjecting the Turbo coded data to channel interleaving;

Step S4: subjecting the channel interleaved data to multiple times of frequency domain information diversity copy within the same symbol to thereby generate the data symbol.

Figure 5:
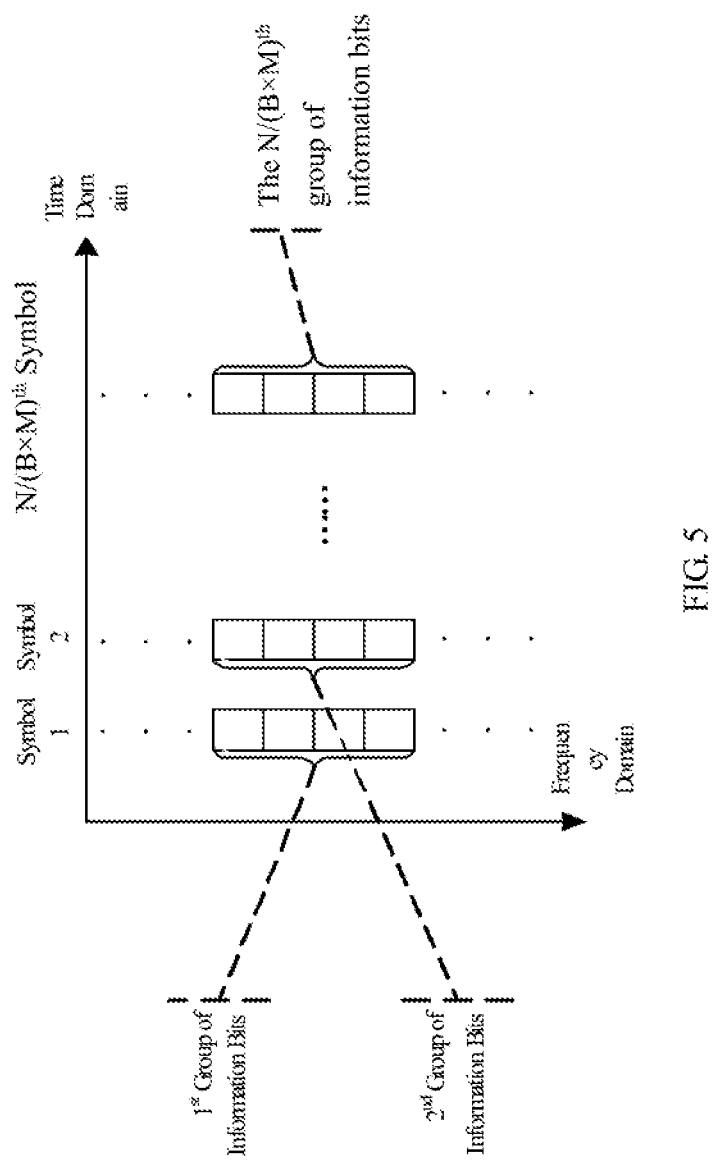
FIG. 5 is a schematic diagram of multiple times of frequency domain information diversity copy.

As shown in FIG. 5, in step S4, the multiple times of frequency domain information diversity copy specifically comprises:

dividing N information bits into groups based on the number of times B×M of diversity copy, each group including N/(B×M) information bits;

mapping, according to a mapping rule, N/(B×M) information bits in the first group to a group of all available N/(B×M) subcarriers of the first symbol;

mapping, according to the mapping rule, N/(B×M) information bits in the second group to a group of all available N/(B×M) subcarriers of the second symbol;

and so on, till transmitting all the B×M groups of information data;

where N denotes the number of bits of Turbo coded data. For example, to transmit 136-byte data, the number of bytes of the Turbo coded data is 136×2=272 bytes; then the number of bits of the data is 272×8=2176 bits in total;

B denotes the number of bits of the information that may be carried by each modulated subcarrier, wherein different modulation schemes correspond to different values, e.g., B value of BPSK (Binary Phase Shift Keying) is 1; B value of QPSK (Quadrature Phase Shift Keying) is 2; and B value of 16 QAM (quadrature amplitude modulation) is 4;

M denotes the number of times of diversity copy; the value of M should be selected to best satisfy the divisible total number of available modulated subcarriers; if the total number of available modulated subcarriers cannot exactly divide M, the remained modulated subcarriers are populated with pseudo-random codes; the typical values of M are 1, 2, 4, 5, 7, 11;

The larger the M value, the larger the number of times of spreading, and the stronger the error correction function; the larger the values of N and M, the more data need to be transmitted on the time domain, and the larger the number of symbols needed.

The mapping rule refers to mapping according to a sequential or any kind of correspondence relationship (e.g., interleaving).

The mapping scheme refers to mapping according to a sequential or any kind of correspondence relationship (e.g., interleaving).

Spreading within the same symbol means that the same information bit can only be mapped and replicated within one symbol according to a certain rule, while another information bit may be mapped and replicated in another symbol.

With BPSK modulation as an example, wherein the B value is 1, then multiple times of frequency domain information diversity copy comprises:

dividing N information bits into groups based on the number of times M of diversity copy, each group including N/M information bits;

mapping, according to a mapping rule, N/M information bits in the first group to a group of all available N/M subcarriers of the first symbol;

mapping, according to the mapping rule, N/M information bits in the second group to a group of all available N/M subcarriers of the second symbol;

and so on, till transmitting all the M groups of information data;

With QPSK modulation as an example, wherein the B value is 2, then multiple times of frequency domain information diversity copy comprises:

dividing N information bits into groups based on the number of times 2M of diversity copy, each group including N/2M information bits;

mapping, according to a mapping rule, N/2M information bits in the first group to a group of all available N/2M subcarriers of the first symbol;

mapping, according to the mapping rule, N/2M information bits in the second group to a group of all available N/2M subcarriers of the second symbol;

and so on, till transmitting all the 2M groups of information data;

With 16 QAM modulation as an example, wherein the B value is 4, then multiple times of frequency domain information diversity copy comprises:

dividing N information bits into groups based on the number of times 4M of diversity copy, each group including N/4M information bits;

mapping, according to a mapping rule, N/4M information bits in the first group to a group of all available N/4M subcarriers of the first symbol;

mapping, according to the mapping rule, N/4M information bits in the second group to a group of all available N/4M subcarriers of the second symbol;

and so on, till transmitting all the 4M groups of information data;

The approach of multiple times of frequency domain information diversity copy for higher order of modulation is similar to the above approach, which is only required to determine the corresponding B value.

According to the present disclosure, when generating a data symbol in power line carrier communication, multiple times of frequency domain information diversity copy is used in place of the conventional ROBO copy, such that the diversity copy is independent of channel time-varying property, but only dependent on channel characteristics; as such, diversity copy is implemented within the same symbol, which facilitates simplifying the processing circuit of frequency domain and meanwhile enhances communication reliability.

Although the contents of the present disclosure have been described in detail through the foregoing preferred embodiments, it is noted that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

We claim:

1. A method for generating a data symbol in power line carrier communication, comprising steps of:
   Step S1: subjecting to-be-transmitted data to scramble processing;
   Step S2: subjecting the scrambled data to Turbo coding;
   Step S3: subjecting the Turbo coded data to channel interleaving;
   Step S4: subjecting the channel interleaved data to multiple times of frequency domain information diversity copy within the same symbol to thereby generate the data symbol;
   wherein in step S4, the multiple times of frequency domain information diversity copy specifically comprises:
   dividing N information bits into groups based on the number of times B×M of diversity copy, each group including N/(B×M) information bits;
   mapping, according to a mapping rule, N/(B×M) information bits in the first group of the groups to a group of all available N/(B×M) subcarriers of a first symbol;
   mapping, according to the mapping rule, N/(B×M) information bits in the second group of the groups to a group of all available N/(B×M) subcarriers of a second symbol;
   mapping, according to the mapping rule, N/(B×M) information bits in the $B \times M^{th}$ group of the groups to a group of all available N/(B×M) subcarriers of a $B \times M^{th}$ symbol; and
   transmitting all the B×M groups of information data, after being mapped;
   where N denotes the number of bits of Turbo coded data;
   B denotes the number of bits of the information that may be carried by each modulated subcarrier; and
   M denotes the number of times of diversity copy.

2. The method for generating a data symbol in power line carrier communication according to claim 1, wherein the mapping rule refers to mapping according to a sequential correspondence relationship.

3. A method for spreading data symbol frequency domain information in power line carrier communication, comprising:
   dividing N information bits into groups based on the number of times B×M of diversity copy, each group including N/(B×M) information bits;
   mapping, according to a mapping rule, N/(B×M) information bits in the first group of the groups to a group of all available N/(B×M) subcarriers of a first symbol;
   mapping, according to the mapping rule, N/(B×M) information bits in the second group of the groups to a group of all available N/(B×M) subcarriers of a second symbol;
   mapping, according to the mapping rule, N/(B×M) information bits in the $B \times M^{th}$ groups of the groups to a group of all available N/B×M) subcarriers of a $B \times M^{th}$ symbol; and
   transmitting all the B×M groups of information data, after being mapped;
   where N denotes the number of bits of Turbo coded data;
   B denotes the number of bits of the information that may be carried by each modulated subcarrier; and
   M denotes the number of times of diversity copy.

4. The method for spreading data symbol frequency domain information in power line carrier communication according to claim 3, wherein the mapping rule refers to mapping according to a sequential correspondence relationship.

* * * * *